LIGHT CONTROLLED VARIABLE FREQUENCY GUNN EFFECT OSCILLATOR

Filed May 2, 1968 2 Sheets-Sheet 1

INVENTOR.
WILLIAM H. HAYDL

BY

[signature]

ATTORNEY

LIGHT CONTROLLED VARIABLE FREQUENCY GUNN EFFECT OSCILLATOR

Filed May 2, 1968 2 Sheets-Sheet 2

INVENTOR.
WILLIAM H. HAYDL
BY
[signature]
ATTORNEY

United States Patent Office 3,538,451

Patented Nov. 3, 1970

3,538,451

LIGHT CONTROLLED VARIABLE FREQUENCY GUNN EFFECT OSCILLATOR

William H. Haydl, Tarzana, Calif., assignor to North American Rockwell Corporation Filed May 2, 1968, Ser. No. 726,005
Int. Cl. H03b 7/00
U.S. Cl. 331—66 8 Claims

ABSTRACT OF THE DISCLOSURE

A method and apparatus are described for generating microwaves by utilizing the Gunn effect in crystalline solids, e.g., GaAs, to produce an oscillating current having a variable frequency. The variable frequency is obtained by controlling the illumination intensity along one surface of the photoconducting semiconductor so as to generate a shadow or other difference in the illumination level. In this manner at the point of illumination difference a high field domain is nucleated. By selectively positioning this point the microwave frequency may be varied.

BACKGROUND

The Gunn effect is a time dependent negative differential bulk phenomena based upon the conduction band structure of the semiconductor. Both high mobility and low mobility electrons are provided in these structures with the former dominating at low fields and the latter at high fields. For a more detailed explanation see U.S. Pat. No. 3,365,583 and IEEE Spectrum, May 1967, pp. 71–77. In general, the Gunn effect results in the generation in the semiconductor of traveling domains of high and low fields which may be considered as traveling concentrations of electric field which produce microwave oscillations of the current. Recently variable frequency oscillations have been obtained utilizing Gunn effect devices. The frequency of such devices in which a traveling high electric field domain causes periodic fluxuations in the current has been controlled by varying the domain velocity or by controlling the distance the domain travels. In general, large frequency variations are possible only by varying the point of nucleation or the point of collapse of the traveling field domain. Frequency tuning ranges of about two to one have been obtained by using particular semiconductor geometries; for example, tapered diodes which exhibit a decreasing electric field from cathode to anode (M. Shoji, Proc. IEEE 55,130 (1967)). Other devices achieve frequency variation by the changes in the carrier density resulting from varying the excess voltage across the domain. The present invention is directed to devices for generating variable microwave frequencies which utilize a new method for regulating in any desired manner the oscillation frequency of a photoconducting Gunn effect diode.

SUMMARY OF THE INVENTION

This invention is directed to microfave generating semiconducting devices of photoconducting semiconductor material utilizing the Gunn effect which have variable microwave frequency outputs. The variation may be controlled externally by illuminating selected portions along at least one of the photoconducting semiconductor surfaces. Thus, when a very thin shadow line is projected on an illuminated photoconducting semiconductor which exhibits the Gunn effect, the oscillation frequency will correspond to the distance between the shadow and the anode. Frequency variations over a wide range, e.g., 5:1, are obtainable by varying the position of the shadow on the illuminated surface or the position of a point of difference in the illumination level.

DESCRIPTION OF THE PREFERRED EMBODIMENT

The present invention is directed to a new method of continuously varying the oscillation frequency of a Gunn effect diode. By using a photoconducting semiconductor the traveling domain inside the body can be nucleated at an artificially created region of high electric field. Illumination of the sample with light results in an increase in the sample current since the carrier density is increased. In the present invention, see FIG. 1*a*, the point of nucleation is created in a photoconducting semiconductor body 1 exhibiting the Gunn effect between appropriate voltage terminals 2 and 3 by projecting a shadow 4 (i.e., a difference in the level of illumination) on the illuminated surface which shadow results in the nucleation of the domain. The reason for this is clear when it is considered that the carrier density is low at the shadow 4 and the field is higher than in the rest of the sample. Therefore, the domain travels to the anode 2 generating a microwave frequency determined by that distance between shadow 4 and anode 2. As the distance is changed, the microwave frequency is similarly varied.

Figure 1A:
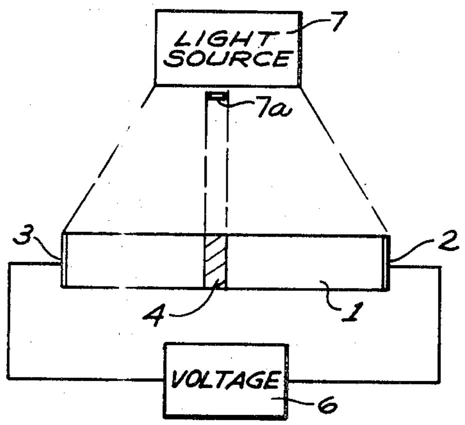
FIG. 1*a* is a schematic top view of a device of the present invention utilizing the method for varying the frequency of oscillations.

The system shown in FIG. 1*a* comprises a photoconducting semiconductor body 1, having an anode 2, cathode 3, preferably located on opposite ends thereof, to which is connected a variable voltage source 6. Adjacent at least one surface of the body 1 is a source of light 7 which has a variety of lights and one or more means 7*a* for casting shadows 4 or changing the light intensity at different places at different and preprogrammed times, e.g., filters, screens, lenses, arrays of small light sources, light pipes, solid state lasers, and similar devices, all of which are well-known to those skilled in the optical arts. In the example shown in FIG. 1*a* the shadow generating means 7*a* is movable so as to be capable of casting a shadow 4 at any point on body 1.

Figure 1B:
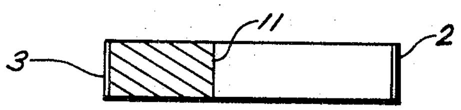
FIGS. 1*b*–1*e* show various schematic and corresponding characteristics of the devices of FIG. 1*a*.
Figure 1C:
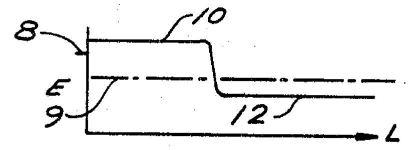
Figure 1D:
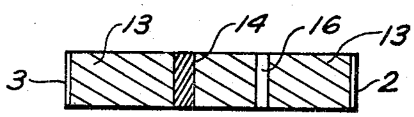
Figure 1E:
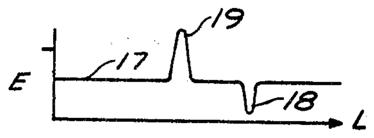

The preferred device, as shown in the system of FIG. 1*a*, utilizes a GaAs photoconducting semiconductor body 1 having a carrier concentration when illuminated of about $5\times10^{14}$ cm.$^{-3}$ and a mobility of 7,000 cm./v.-sec. Carrier density or carrier concentration refers to the density of conduction band electrons. Illumination refers to radiation with electromagnetic energy of a wavelength sufficiently short to excite electrons from the valance band of the GaAs semiconductor to the conduction band thus increasing the number of excited electrons already present in the conduction band. The separation in energy levels between maxima of conduction and valance band electrons is commonly called the band gap. If the photon energy of the illumination is below the band gap energy, no excitation of valance band carriers is achieved. As illumination frequency increases, absorption of the illumination goes up with decreasing wavelength and penetration into the semiconductor goes down. For sufficiently high frequency illumination only the surface electrons of a given semiconductor may be excited. Naturally, the greater the intensity of the illumination the greater the generated carrier density because of the greater number of electrons excited to the conduction band. In the absence of illumination, the region 1 of the photoconducting semiconductor, e.g., GaAs, has a uniform carrier density of less than $10^{12}$ cm.$^{-2}$ divided by the distance in cm. from the shadow region 4 to the anode 2. Thus, when the semiconductor 1 is illuminated, the product of the carrier concentration and the distance from the point of illumination difference to the anode must be greater than $10^{12}$ cm.$^{-2}$. The greater level of illumination in the configuration shown in FIG. 1*a* must be adjacent the anode in order for the traveling domain to result in the generation of microwaves. In FIG. 1*b* the lower level of illumination is shown covering a large portion of the device and not merely a line across the device as in FIG. 1*a*. The field E as a function of the length of the device for the case shown in FIG. 1*b* is depicted in FIG. 1*c*. The threshold for domain generation is shown at point 8 with the field created by the applied voltage having a level as at 9 for uniform illumination. The field created by the applied voltage must be less than the threshold which would result in Gunn effect oscillations. The increased field at 10 will result from the change in the illumination level, i.e., at the point 11 in FIG. 1*b*. If the illumination difference is very large so that the field 10 is above threshold and the field 12 is below a required sustaining field (i.e., the field required to sustain propagation of the domain), the oscillation frequency is a function of the distance from the cathode to the point 11. If the field 12 is above the defined sustaining field requirement, well-known in the art of Gunn effect physics, then the oscillation frequency is a function of the anode-cathode spacing as in a regular Gunn effect device. If the polarity of the applied voltage on the device of FIG. 1*b* is reversed then the domain will be generated at 11 and travel toward the electrode 3 which, under this arrangement, would then be the anode. FIG. 1*d* shows one level of illumination 13 uniform across the semiconductor 1. A shadow is projected at 14 and an increased level of illumination 16 is projected at a point between the shadow 14 and the anode 2. This arrangement would ordinarily result in an electric field level 17 in FIG. 1*e* being generated across the body with the decreased field at 18 resulting from the increase in illumination level at 16, and an increased field at 19 resulting from the decreased illumination level at 14. As a result a traveling domain would move across from the field peak 19 toward the anode 2 located to the right. However, this oscillation can be interrupted either permanently or intermittently by illuminating a region 16 with light of greater intensity than the surrounding area 13 to generate a low field which is less than the field required to sustain the domain, as at 18 in FIG. 1*e*. Thus, a combination of varying the distance between the change in illumination level 14 and the anode 2, with an intermittent increased illumination pattern 16, could generate any preselected sequence of frequency signals. Further, by properly selecting the frequency of the illuminating light and the light frequency response characteristics of the semiconductor, amplitude modulation could be factored into the device output based upon the response of the semiconductor body, i.e., carrier density changes, to different light frequencies.

The increased illumination level 16 superimposed on the illuminated portion 13 between the change in illumination 14 and the anode 2 results in a region of high carrier density being generated which inhibits the passage of a traveling domain and thereby prevents further microwave generation.

Figure 3:
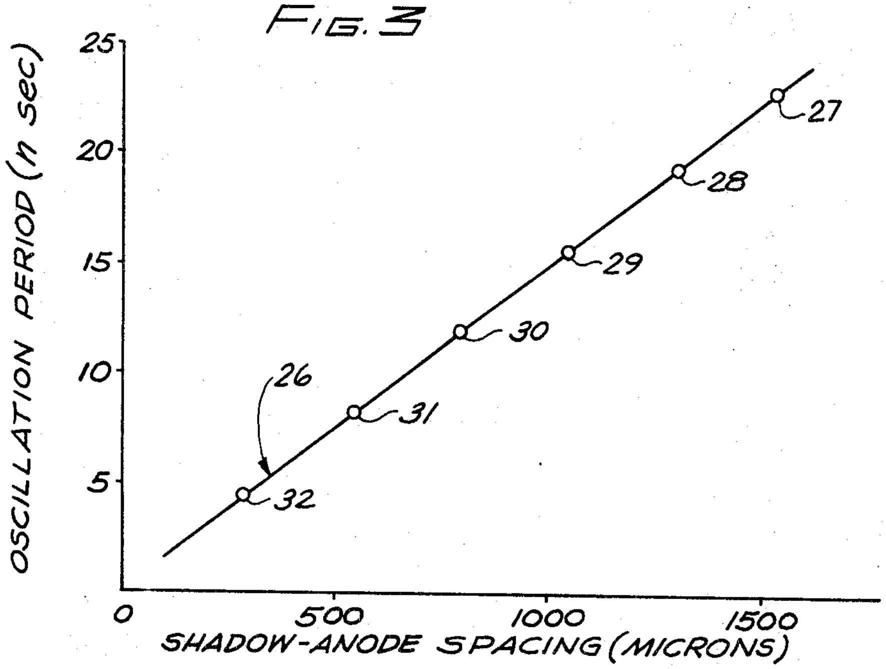
FIG. 3 shows the oscillation periods as a function of the distance between the shadow and the anode.
Figure 2:
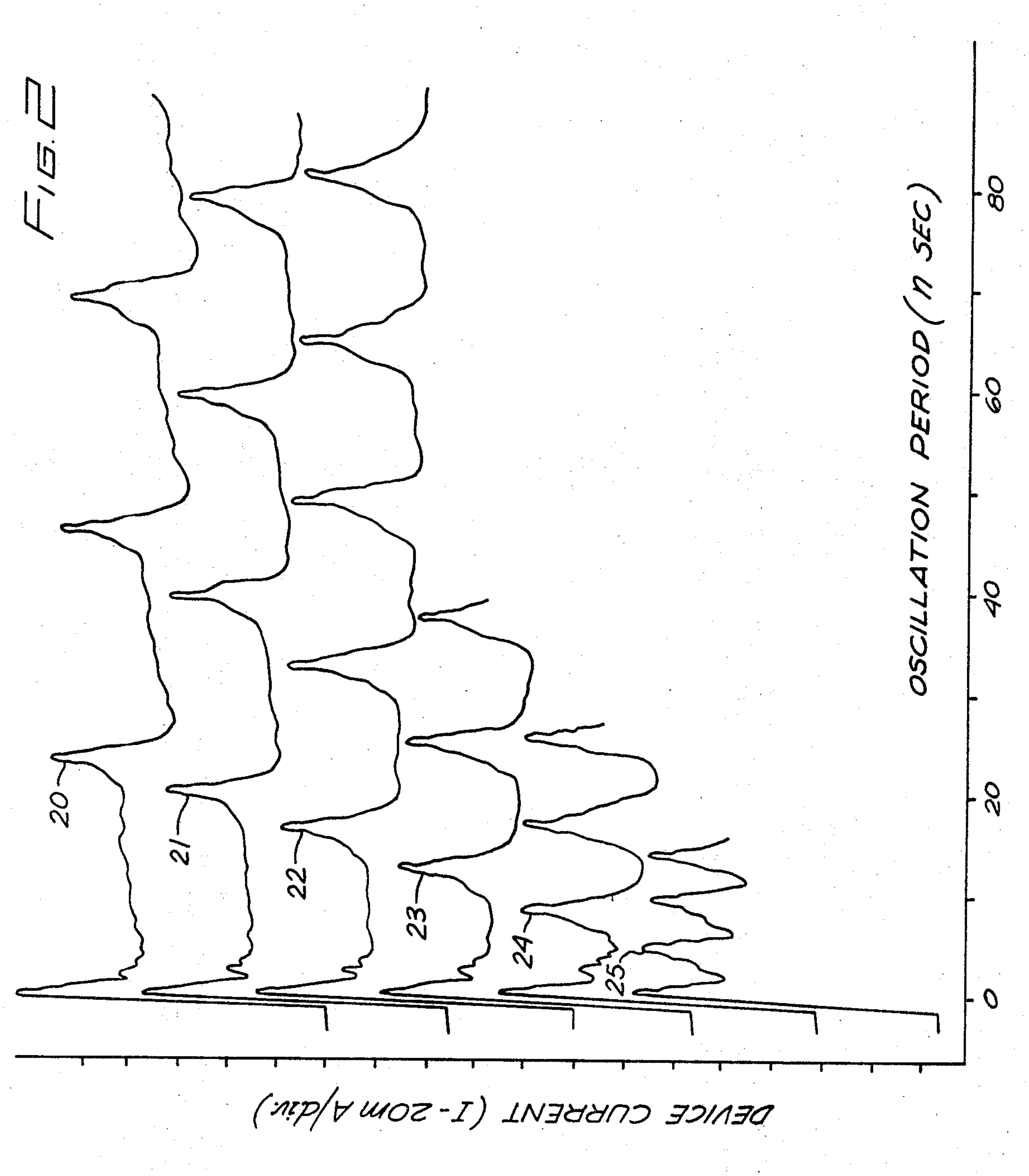
FIG. 2 shows the effect on frequency of moving a thin shadow line from the cathode to the anode.

Anode 2 and cathode 3, preferably thin, were alloyed in a standard manner to the body 1 which was 1700 microns long and 375 microns wide and 50 microns thick. One surface of the semiconductor body was illuminated with ordinary white light (microscope lamp) and a difference in the illumination level was generated by projecting a 50 micron wide shadow, as at 4 in FIG. 1*a*, onto the uniformly illuminated surface. The shadow in the particular embodiment was a line preferably oriented normal to the current flow. By moving the shadow line 4 in the longitudinal direction along one surface of the body 1 the oscillation frequency was varied continuously over a large range. This is shown in FIG. 2 where the sample current wave forms for various positions along the length of the semiconductor body of FIG. 1*a* are presented. Curve 20 is for a positioning of the shadow line 4 about 1550 microns from the anode 2. As this shadow line 4 is moved towards the anode 2 in 250 micron steps, it is apparent from curves 21–25, i.e., for distances of 1300, 1050, 800, 550 and 300 microns, respectively, that the frequency significantly increases from a current peak having a period of 23.2 nsec. for curve 20 to one having a period of 4.75 nsec. for curve 25. FIG. 3 shows the variation in the period with the distance (in microns) between the point at which the illumination level changes (shadow) and the anode 2. The curve 26 is defined by points 27–32 corresponding to the period for the curves 20–25 of FIG. 2, respectively. Thus, FIG. 3 shows how the oscillation period may be selectively varied by changing the shadow to anode spacing. For the particular example utilizing a semiconductor 1700 microns long, it can be seen that variations of the period in 250 micron steps forms a straight line 26 representing an average domain velocity of $6.6\times10^6$ cm./sec. The domain velocity of a second photoconducting semiconductor made from the same material having the same dimensions was $7.7\times10^6$ cm./sec. This variation in domain velocity may result from small variations in the applied voltage.

The shadow indicated by 4 in FIG. 1*a* creates a high resistivity, high electric field region. When an applied voltage is connected across leads 2 and 3 of the device of FIG. 1*a* the field throughout the sample rises. In the present invention the applied voltage alone must be insufficient to initiate Gunn effect oscillation in the case of uniform illumination. However, because of the higher field in the shadow region, the field at this point will reach threshold first. As a result, a domain will begin to form there while the field outside the domain will decrease and never reach threshold.

If the difference in the electric field of the shadow region as compared to the semiconductor is small, as the applied voltage to the semiconductor increases, a domain will begin to form in the shadow region 4, but before it has fully matured the field at the cathode will have reached threshold. In this case a second domain will be created at the cathode and, depending upon the growth rates of the two domains, one domain will reach maturity and the other will collapse. This is apparently the phenomena taking place at low illumination level, that is, where the difference in illumination levels is insufficient to create about a 10 to about a 20 percent difference in carrier density. Thus, the difference in illumination level must be sufficient to create a carrier density difference of at least about 10 percent. It is also apparent that the shadow or other point of different illumination level may be scanned across the semiconductor surface so that a continuously varying frequency microwave is generated. In addition, the light intensity can be changed to vary the oscillation frequency or, where this intensity is near the threshold field, a switching on and off may be attained. Other switching actions are possible such as the injection of a brighter lighted area into the traveling domain region between the shadow and the anode as noted above. It is apparent that multiple light sources or shadows of the same or different intensity level may be positioned along the surface through which the traveling domains are generated and programmed to cause various frequencies to be generated at preselected times. In addition, the area illuminated on the surface of the body may take various geometric forms so as to change the effective cross sectioned area of the body in which the traveling domains are generated and propagated. The current flow in a body and the frequency of oscillation can be modified by such geometric light patterns. While the above description has been directed to the illumination of one surface, it is within the purview of the present invention to create different illumination levels on the one or more surfaces, either adjacent or opposite, and either simultaneously or in some programmed manner to generate a preselected series of different frequencies, pulses or trains of pulses. Such schemes may be particularly useful for the conversion of light pulses to microwave oscillations. It is also within the purview of the present invention to vary the frequency of the illuminating light so as to effect carrier concentrations and resulting amplitude changes in the output. In those cases where an increased illumination level 16 (FIG. 1*d*) is projected through a slit onto the semiconductor body to stop domain generation, the difference in the illumination level as between 16 and the surrounding level 13, i.e., the difference between the field at 17 and the depth of peak 18, may be small.

In the various arrangements described above utilizing the method and apparatus of the present invention abrupt changes in the illumination levels have been utilized. However, it is clear that gradual changes in illumination, either linear or non-linear, may be utilized so as to provide a continuous series of points of illumination difference. The domain generation will take place at the cathode and travel towards the anode unless the illumination level becomes great enough to terminate the traveling domain. The domain travels in the direction of the increasing light intensity until that intensity is sufficiently great to terminate the traveling domain as noted above.

While the preferred embodiments of the present invention have been described, it is apparent that many modifications will occur to those skilled in the art. Therefore, the foregoing examples of the present invention are limited only by the following claims.

I claim:

1. A method of generating variable frequency microwave oscillations from a Gunn effect source having a photoconducting semiconductor body comprising the steps of applying a voltage across said body of a magnitude insufficient to initiate oscillation, generating at least two points of difference in the illumination level on at least one surface of said semiconductor body, a first difference in illumination level being sufficient to generate a carrier density difference and create a region of sufficiently high electric field to result in the nucleation of a traveling domain at said region of first illumination difference, a second difference in illumination level being sufficient to generate a carrier density difference and create a barrier region of decreased electric field between the point where said traveling domain is generated and the end of said body toward which said traveling domain travels.

2. The method of claim 1 including the step of scanning at least one surface of said semiconductor body with at least two points of difference in illumination level.

3. The method of claim 1 including the step of varying the illumination intensity of at least one of said illumination levels.

4. The method of claim 1 including the step of varying the applied voltage across said semiconductor body while maintaining it insufficient to initiate oscillation.

5. The method of claim 1 including the step of moving said points of illumination level difference between at least two points on at least one surface of said semiconductor body.

6. A variable frequency Gunn effect oscillator system comprising a body of photoconductive semiconductor material, means for applying a voltage across an anode and cathode connected to said body, means for generating at least two points of illumination level difference on one surface of said photoconductive semiconductor material body, said photoconductive semiconductor material body having a carrier density on the side of a first point of illumination difference of greater illumination which is greater than $10^{12}$ cm.$^{-2}$ divided by the difference in cm. from said point of first illumination level difference to the domain termination point, said domain termination point being provided by a second point of illumination difference which creates a low electric field barrier.

7. The oscillator system of claim 6 wherein said means for generating a point of illumination level difference includes a plurality of means for generating a plurality of illumination level differences on said photoconductive semiconductor material body.

8. The oscillator system of claim 7 wherein the illumination level difference generated by said plurality of means for generating a plurality of illumination level differences are movable in linear relationship to the surface of said photoconductive semiconductor material body.

References Cited

UNITED STATES PATENTS

| | | |
|---|---|---|
| 3,336,535 | 8/1967 | Mosher. |
| 3,435,307 | 3/1969 | Landauer. |
| 3,440,425 | 4/1969 | Hutson et al. |

OTHER REFERENCES

Copeland: "Characterization of Bulk Negative Resistance Diode Behavior," IEEE Transactions on Electron Devices, vol. ED–14, September 1967, pp. 461–463.

ROY LAKE, Primary Examiner

S. H. GRIMM, Assistant Examiner

U.S. Cl. X.R.

307—311; 317—234; 331—107